US011677276B2

United States Patent
Masuda

(10) Patent No.: US 11,677,276 B2
(45) Date of Patent: Jun. 13, 2023

(54) NON-CONTACT OPTICAL POWER FEEDING METHOD USING A MULTI-JUNCTION SOLAR CELL, AND LIGHT-PROJECTING DEVICE FOR OPTICAL POWER FEEDING

(71) Applicant: TOYOTA JIDOSHA KABUSHIKI KAISHA, Toyota (JP)

(72) Inventor: Taizo Masuda, Yokohama (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 17/235,154

(22) Filed: Apr. 20, 2021

(65) Prior Publication Data

US 2021/0391755 A1   Dec. 16, 2021

(30) Foreign Application Priority Data

Jun. 16, 2020   (JP) .............................. JP2020-103720

(51) Int. Cl.
*H02J 50/30* (2016.01)
*H02S 10/40* (2014.01)
(Continued)

(52) U.S. Cl.
CPC .............. *H02J 50/30* (2016.02); *B60L 8/003* (2013.01); *F21S 8/086* (2013.01);
(Continued)

(58) Field of Classification Search
None
See application file for complete search history.

(56) References Cited

U.S. PATENT DOCUMENTS 3,971,454 A   7/1976  Waterbury
6,792,259 B1 *  9/2004  Parise ................ H01M 10/443
                                                           455/343.1
(Continued)

FOREIGN PATENT DOCUMENTS

CN   108649714 A  * 10/2018
JP   2004-296658 A   10/2004
(Continued)

OTHER PUBLICATIONS

"Started demonstration of driving on public roads of electric vehicles equipped with the world's highest level of high-efficiency solar cells—Verify the possibility of using solar cells to reduce CO2 emissions in the transportation field—," National Research and Development Corporation New Energy Industrial Technology Development Organization, Sharp Corporation and Toyota motor Corporation, Jul. 4, 2019.
(Continued)

*Primary Examiner* — Daniel Cavallari
(74) *Attorney, Agent, or Firm* — Oliff PLC

(57) ABSTRACT

There are provided a method and a device for feeding electric power to a vehicle, etc. installed with a solar photovoltaic power generation panel employing a multi-junction solar cell in a non-contact manner by irradiating light to the solar photovoltaic power generation panel. In the method, light containing a wavelength component absorbed by each of all solar cell layers laminated in a multi-junction solar cell of the vehicle, etc. is projected from a light-projecting device to the light receiving surface of the multi-junction solar cell; and electric power generated by the irradiation of light from the multi-junction solar cell is taken out. The device includes structures for emitting light containing a wavelength component absorbed by each solar cell layer laminated in the multi-junction solar cell, and for irradiating the light to a light receiving surface of the multi-junction solar cell.

9 Claims, 3 Drawing Sheets

(51) Int. Cl.
*H02J 50/40* (2016.01)
*B60L 8/00* (2006.01)
*F21S 8/08* (2006.01)
*H01L 31/0725* (2012.01)
*F21Y 115/30* (2016.01)
*F21Y 115/10* (2016.01)
*F21W 131/103* (2006.01)

(52) U.S. Cl.
CPC .......... *H01L 31/0725* (2013.01); *H02J 50/40* (2016.02); *H02S 10/40* (2014.12); *F21W 2131/103* (2013.01); *F21Y 2115/10* (2016.08); *F21Y 2115/30* (2016.08)

(56) References Cited

U.S. PATENT DOCUMENTS

| 10,155,586 | B2 | 12/2018 | Liu et al. |
| 2004/0187912 | A1 | 9/2004 | Takamoto et al. |
| 2019/0178268 | A1 | 6/2019 | Shah |

FOREIGN PATENT DOCUMENTS

| JP | 2008-130922 A | 6/2008 |
| JP | 2014-017321 A | 1/2014 |
| JP | 2015-130389 A | 7/2015 |
| JP | 2016-096707 A | 5/2016 |
| JP | 2019-013063 A | 1/2019 |
| JP | 2019-511407 A | 4/2019 |
| WO | 2017/210170 A1 | 12/2017 |

OTHER PUBLICATIONS

Iyer, Vikram et al., "Charging a Smartphone Across a Room Using Lasers," Proceedings of the ACM on Interactive, Mobile, Wearable and Ubiquitous Technologies, Dec. 2017, vol. 1, No. 4, Article 143.

Helmers, Henning and Andreas W. Bett, "Photovoltaic Laser Power Converters for Wireless Optical Power Supply of Sensor Systems," 2016 IEEE International Conference on Wireless for Space and Extreme Environments (WiSEE), 2016, pp. 152-154.

Khvostikov, Vladimir et al. "AlGaAs Converters and Arrays For Laser Power Beaming," AIP Conference Proceedings 1679, Sep. 2015, pp. 130002-1-130002-6.

\* cited by examiner

NON-CONTACT OPTICAL POWER FEEDING METHOD USING A MULTI-JUNCTION SOLAR CELL, AND LIGHT-PROJECTING DEVICE FOR OPTICAL POWER FEEDING

CROSS-REFERENCE TO RELATED APPLICATION

This application claims priority to Japanese Patent Application No. 2020-103720 filed on Jun. 16, 2020, which is incorporated herein by reference in its entirety including the specification, drawings, and abstract.

TECHNICAL FIELD

This disclosure relates to an optical power feeding method (a method for feeding electric power to a vehicle or an apparatus, etc. by providing light to a photoelectric conversion element), and a device for it, and more specifically to a method of feeding electric power to an arbitrary apparatus or a vehicle in a non-contact manner using a multi-junction solar cell (also called as a hybrid type solar cell, a tandem type solar cell, etc.) employed in a solar (photovoltaic) power generation panel, and a light-projecting device for optical power feeding for the method.

BACKGROUND ART

As one of the solar photovoltaic technology, there is known a multi-junction solar cell in which a plurality of solar cell layers (layered photoelectric conversion elements) having mutually different energy band gaps are laminated and joined so as to use the sunlight energy that a photovoltaic power generation panel receives as efficiently as possible, improving the energy conversion efficiency (photoelectric conversion efficiency) from the sunlight to the electricity. According to the multi-junction solar cell, since not only the light component of a certain specific wavelength band but also the light components of two or more wavelength bands within the sunlight covering a wide range of wavelength band can be converted into electricity with a small voltage loss, it becomes possible to convert much more light energy into electrical energy and use it. Thus, various structures relating to the multi-junction solar cell have been proposed and practically used. For instance, in JP2004-296658, it is proposed that, in a generally known three-junction solar cell composed of InGaP/InGaAs/Ge, the efficiency of the multi-junction solar cell is improved by using aluminum in the InGaP layer to be a top cell and adjusting the aluminum composition ratio. Also, there has been proposed a technique of installing a solar power panel employing a multi-junction solar cell on a vehicle, such as a car, for using electric energy obtained from the sunlight energy in the solar power panel as running energy of the vehicle ("Starting verification of the running on a public road of an electric vehicle installed with a high efficient solar cell of world's best standards—the possibility of practical use of solar cells has been verified for the reduction of $CO_2$ emission in the transportation field" New Energy and Industrial Technology Development Organization, Sharp K.K., Toyota Jidosha K.K. Jul. 4, 2019 https://global.toyota/jp/newsroom/corporate/28781301.html). On the other hand, as a technique using a photoelectric conversion element such as a solar cell, there has been proposed an electric power feeding method by irradiating a photoelectric conversion element with light to obtain electric power. Vikram Iyer, et al. (Charging a Smartphone Across a Room Using Lasers Vikram Iyer, Elyas Bayati, Rajalakshmi Nandakumar, Arka Majumdar, Shyamnath Gollakota Proceedings of the ACM on Interactive, Mobile, Wearable and Ubiquitous Technologies January 2018 Article No.: 143 https://doi.org/10.1145/3161163) proposes a structure in a mobile computing device, such as a smart phone, installed with a photoelectric conversion element, where a single junction type photoelectric conversion element is irradiated with laser light away from it so as to feed electric power in a non-contact manner. JP2016-096707 proposes a laser light power generator having a structure where laser light is remotely irradiated directly and precisely on a single photoelectric conversion element. JP2008-130922 proposes a structure of generating electric power by introducing laser light, obtained by causing a laser oscillation through sunlight excitation, into a monochromatic light solar cell with an optical fiber.

SUMMARY

For the reduction of carbon-dioxide emissions, fuel consumption improvement and environmental preservation, there have been advanced developments of structures of utilizing electrical energy converted from solar energy by a solar photovoltaic power generation panel as described above, installed on a vehicle, such as an automobile, or other mobile body, for energy for the running or moving of the mobile body or other energy consumed during its operation. It is expected that, in the near future, the number of the vehicles or other mobile bodies installed with a solar photovoltaic power generation panel increases explosively. Further, it is expected that the structure using electrical energy converted from solar energy by a solar photovoltaic power generation panel will be used not only for vehicles or mobile bodies but for machinery and appliance in various fields.

By the way, in the cases of vehicles, mobile bodies or other machinery and appliance (hereinafter, referred to as "vehicle, etc."), which are installed with a solar photovoltaic power generation panel as noted above and driven by using electrical energy converted from solar energy, although the energy can be obtained when the panel is irradiated with sufficient sunlight, no energy will be obtained without the sunlight, such as during night time. Also, even in the presence of the sunlight, when a sufficient light amount does not reach a solar photovoltaic power generation panel (in a rainy weather, in a cloudy weather, at dawn, in the evening, under shade, etc.) or when large energy is required for the driving of a vehicle, etc., it can occur that energy cannot be obtained at a degree required for the driving of the vehicle, etc. from electrical energy converted from solar energy. Thus, in the case of a vehicle, etc. installed with a solar photovoltaic power generation panel, for a case where electric energy obtained by conversion from solar energy alone is not enough to drive the vehicle, etc., it is preferable that electric power can be fed to a vehicle, etc. in a different way. In particular, since vehicles or mobile bodies always move place to place, electric power feeding can be achieved in a non-contact manner, and in the case of a vehicle, etc. installed with a solar photovoltaic power generation panel, non-contact electric power feeding to a vehicle, etc. can be achieved by irradiating a solar photovoltaic power generation panel with light artificially. Then, it can be considered that non-contact electric feeding to a vehicle, etc. can be achieved by preparing a light-projecting device for irradiating a solar photovoltaic power generation panel with light (a light-projecting device for optical power feeding) and irradiating the solar photovoltaic power generation panels on the vehicle, etc. with artificial light from the light-projecting device.

Moreover, with respect to the non-contact electric power feeding by the irradiation of a solar photovoltaic power generation panel on a vehicle, etc. with light as mentioned above, in the solar photovoltaic power generation panel for the use of electric energy converted from solar energy as noted above, a multi-junction solar cell is employed in many cases in order to improve the conversion efficiency from sunlight to electricity. In the case of the multi-junction solar cell, several solar cell layers having mutually different energy band gaps are laminated, where those solar cell layers have been electrically connected in series, and thus, if no light absorption occurs so that no electric power can be generated in at least one cell layer within the series-connected solar cell layers, electric current could not flow through all the solar cell layers and thus electric power could not be taken out. Accordingly, for feeding electric power to a vehicle, etc. installed with a solar photovoltaic power generation panel by irradiating the solar photovoltaic power generation panel with light, it will be required that the light to be irradiated is composed to include wavelength components absorbed in respective solar cells so that light absorption will occur and electric current will be generated in all the solar cell layers laminated in the solar photovoltaic power generation panel. Furthermore, in that case, it is more preferable that the energy of the light irradiated to the solar photovoltaic power generation panel can be converted into electrical energy as efficiently as possible (with the least loss).

Thus, the main object of the present disclosure is to provide a new method of feeding electric power to a vehicle etc. installed with a solar photovoltaic power generation panel in a non-contact manner by irradiating the solar photovoltaic power generation panel with light and a device for the method.

Further, another object of the present disclosure is to provide a method and a device of non-contact electric power feeding to a vehicle, etc. installed with a solar photovoltaic power generation panel as described above, in which, when a multi-junction solar cell is employed in the solar photovoltaic power generation panel, the light containing wavelength components, which is so composed that each solar cell layer in the multi-junction solar cell can generate electric current and thereby electric power can be taken out, is irradiated on the solar photovoltaic power generation panel.

According to one manner of the present disclosure, the above-mentioned object is achieved by a method of non-contact electric power feeding to a vehicle, etc. installed with a solar photovoltaic power generation panel having a multi-junction solar cell, comprising steps of:
preparing a light-projecting device which emits light containing a wavelength component absorbed by each of all solar cell layers laminated in the multi-junction solar cell and projects the light;
irradiating the light projected from the light-projecting device onto a light receiving surface of the multi-junction solar cell of the solar photovoltaic power generation panel of the vehicle, etc.; and
taking out electric power generated from the multi-junction solar cell by the irradiation of the light.

In the above-mentioned structure, "a vehicle, etc. installed with a solar photovoltaic power generation panel" may be a vehicle, such as an automobile, a mobile body (a vessel, an aircraft, etc.) or other machine and apparatus in which electrical energy converted from solar energy in the solar photovoltaic power generation panel is used as its driving or operation energy. Typically, in such a vehicle, etc., the solar photovoltaic power generation panel is laid on the upper surface (roof, etc.) of the vehicle, etc. so as to be able to receive the sunlight. In this regard, the vehicle, etc. may be provided with a storage battery or an electric storage device so that the electrical energy outputted from the solar photovoltaic power generation panel can be accumulated therein. The "multi-junction solar cell" is a solar cell of a type employed as a photoelectric conversion means in many solar photovoltaic power generation panels as noted above. The multi-junction solar cell has a structure that a plurality of solar cell layers having mutually different energy band gaps are laminated so that the respective solar cell layers will absorb light components of mutually different wavelength bands when the solar cell is irradiated with the sunlight, and thereby it becomes possible to convert as large amount as possible of the solar energy into the electrical energy. In this connection, the number of the laminated solar cell layers is usually two to six, but not limited thereto. The "light-projecting device" is designed, as noted above, to emit light containing the wavelength components absorbed by all the respective solar cell layers laminated in the multi-junction solar cell and to "project" the light, namely to irradiate the light onto a certain spatial region. In this respect, as understood also from explanations described later, since it is preferable that the light projected from a light-projecting device is condensed on the solar photovoltaic power generation panel without any waste in order to suppress energy loss as low as possible, a laser or a LED may be used as a light source of the light (Thus, the light may be laser light or LED light.).

Briefly, the above-mentioned method is a novel method of feeding electric power, namely supplying energy, in a non-contact manner, to a vehicle, etc., which is designed to be capable of using electrical energy converted from solar energy in a solar photovoltaic power generation panel as its driving or operation energy, by irradiating the solar photovoltaic power generation panel with artificially generated light. In that case, when the solar photovoltaic power generation panel employs a multi-junction solar cell, since solar cell layers laminated in the multi-junction solar cell are electrically connected in series, significant electric power cannot be taken out from the multi-junction solar cell unless the light is absorbed and thereby the electric current is generated in all the solar cell layers. Then, in the present method, as described above, the light to be emitted in and projected from the light-projecting device is made to contain a wavelength component absorbed by each of all the solar cell layers laminated in the multi-junction solar cell, and thereby the light absorption and electric current generation occur in all the solar cell layers, so that significant electric power can be taken out from the multi-junction solar cell.

In the concrete steps of the present method, as noted above, first, a light-projecting device which emits and projects the light containing the wavelength components absorbed by all the respective solar cell layers laminated in the multi-junction solar cell is prepared, and the light projected from the light-projecting device is irradiated onto a light receiving surface of the multi-junction solar cell of the solar photovoltaic power generation panel installed on a vehicle, etc. For instance, in a case that a multi-junction solar cell has three solar cell layers (in the case of a three-junction solar cell), in order that light absorption occurs in all the respective three solar cell layers, the light to be irradiated is prepared to contain all the corresponding wavelength components absorbed by the respective three solar cell layers. Thereby, since light absorption occurs and electric current is generated in each layer of the multi-junction solar cell of the solar photovoltaic power generation panel, electric power can be taken out from electrodes provided in both terminals of the multi-junction solar cell, and used for various uses, such as driving a vehicle, etc. According to the structure of the present disclosure, even when the sun does not come out, or even when energy required for driving a machine and/or apparatus in a vehicle, etc. is not fully obtained only from the sunlight even if the sun comes out, the solar photovoltaic power generation panel on a vehicle, etc. is irradiated with the light from the light-projecting device so that the energy of the irradiated light will be converted into electrical energy, namely, electric power will be fed in a non-contact manner, and thereby, the electric power can be used for the driving of the machine and/or apparatus in the vehicle, etc.

In the above-mentioned present method, especially, it is necessary that the light projected from the light-projecting device contains the wavelength component absorbed by each of all the solar cell layers of the multi-junction solar cell, and since a photon is absorbed when it has the energy exceeding a band gap in each solar cell layer, the light projected from the light-projecting device may be prepared to contain photons with energy exceeding the corresponding band gap of each solar cell layer as the wavelength component which each solar cell layer absorbs (namely, the wavelength component which each solar cell layer is made to absorb) (In a multi-junction solar cell, usually, a solar cell layer having a larger band gap (a shorter absorption wavelength) is laid closer to a light receiving side. Accordingly, the light irradiated on the multi-junction solar cell will be absorbed sequentially from the shortest wavelength component. Thus, usually, a multi-junction solar cell is designed such that a wavelength component to be absorbed by a solar cell layer of a short absorption wavelength is not absorbed by a solar cell layer of a long absorption wavelength as much as possible.). More in detail, using the band gap Eg [eV] of each solar cell layer, the Planck constant h [Js], the speed of light c [m/s] and the electron charge (elementary charge) e [C], the wavelength of a photon which has the energy exceeding the band gap of each solar cell layer is not more than the wavelength [nm] given by:

$$h \cdot c/(e \cdot Eg) \qquad (1).$$

Thus, the light projected from the light-projecting device may be prepared to contain a component whose wavelength is shorter than the upper limit wavelength of Expression (1) as the wavelength component absorbed by each solar cell layer. In particular, in a case that each wavelength component of the projected light has a upwardly convex wavelength spectrum like a laser light or an LED light, it is preferable that each peak wavelength is in the shorter wavelength side than the upper limit wavelength described above, and further, it is also preferable that the upper limit (the end of the longer wavelength side) of the wavelength spectrum is in the shorter wavelength side than the upper limit wavelength described above (It is preferable that the amounts of the components in the longer wavelength side of the upper limit wavelength described above are as small as possible because these components hardly contribute to electric power generation.).

On the other hand, with respect to the lower limit (the end of the shorter wavelength side) of the wavelength component made to be absorbed by each solar cell layer in the light projected from the light-projecting device, as understood by one skilled in the art, photon energy becomes higher as the wavelength of the photon absorbed by each solar cell layer is shorter, but, since a generated electric current corresponds to the number of photoelectrons generated by the absorption of photons, the portion of the energy exceeding the band gap Eg in photon energy (the difference between the photon energy and the band gap Eg) is converted into heat so that it will not contribute to the electric power taken out from the solar cell, resulting in the occurrence of the energy loss. Therefore, in order to suppress the energy loss of the projected light as low as possible, it is desirable that the lower limit of the wavelength component is not too short. As noted above, in a case that each wavelength component of the projected light has a upwardly convex wavelength spectrum, it is preferable that the peak wavelength of the wavelength component made to be absorbed by each solar cell layer is adjusted to enter within a range to a lower limit wavelength [nm] which is shorter than the upper limit wavelength by a predetermined width which may be appropriately set in consideration of the degree of the energy loss as mentioned above. In a multi-junction solar cell used for a typical solar photovoltaic power generation panel, concretely, the above-mentioned lower limit wavelength [nm] of each solar cell layer may be, for instance, $h \cdot c/(e \cdot Eg)$ [nm]−100 [nm].

Further, in the above-mentioned multi-junction solar cell, in order to achieve more efficient photoelectric conversion, it is preferable that the electric currents generated in the respective solar cell layers are substantially almost equal to each other. In a multi-junction solar cell, the electric current which can be taken out from the electrodes prepared at the opposite terminals is restricted to the lowest one in the electric currents generated in the respective solar cell layers, and therefore, in each solar cell layer, the energy corresponding to the generated current portion exceeding beyond the lowest generated current will become in vain (resulting in loss). And the magnitude of the electric current generated in each solar cell layer corresponds to the light intensity absorbed in the corresponding solar cell layer. Thus, in order to improve the energy conversion efficiency (photoelectric conversion efficiency) as much as possible, it is preferable that the light intensity of the wavelength component to be absorbed by each of the solar cell layers contained in the light projected from the light-projecting device is adjusted so that the differences in the generated currents among the respective solar cell layers will be within a predetermined allowable range. Here, "a predetermined allowable range" is a range which may be set appropriately to render the photoelectric conversion efficiency to be acceptable, and may be set, for example, so that the difference in the generated currents will be within 10%, preferably within 5% and more preferably within 3%, etc.

Also, as already noted, the electric current generated in a solar cell layer corresponds to the number of photoelectrons generated by absorption of photons. Thus, it is preferable that the light intensity of the wavelength component to be absorbed by each of the solar cell layers contained in the light projected from the light-projecting device is adjusted so that the difference in the number of photoelectrons generated by the absorption of photons among the respective solar cell layers will be in a predetermined allowable range. Here, "a predetermined allowable range" is a range which may be set appropriately to render the photoelectric conversion efficiency to be acceptable, and may be set, for example, so that the difference in the number of photoelectrons will be within 10%, preferably within 5% and more preferably within 3%, etc.

Furthermore, using a light intensity Pi [J/s] of the wavelength component absorbed in each solar cell layer in the output of a light-projecting device or on the light receiving surface of a multi-junction solar cell, a transmissivity Ti of each wavelength component which reaches the corresponding solar cell layer, the Planck constant h [Js], the speed of light c [m/s] and a wavelength λi [nm] of each wavelength component, the number of photons Ni absorbed in each solar cell layer is given by:

$$Ni = Pi \cdot Ti / (h \cdot c / \lambda i) \quad (2).$$

So, the light intensity Pi of each wavelength component may be adjusted so that the difference in the number of photons given by Expression (2) among the respective wavelength components will be in a predetermined allowable range. Here, similarly as above, "a predetermined allowable range" is a range which may be set appropriately to render the photoelectric conversion efficiency to be acceptable, and may be set, for example, so that the difference in the photon counts will be within 10%, preferably within 5% and more preferably within 3%, etc.

In the present method as described above, the irradiation of the light from the light-projecting device to the solar photovoltaic power generation panel of a vehicle, etc. may be performed by an arbitrary structure. When a vehicle, etc. is a vehicle or a mobile body, moving on a ground surface or a water surface, the light-projecting device may be designed to project light onto a solar photovoltaic power generation panel of a vehicle or a mobile body existing on the ground surface or water surface. For instance, the light-projecting device may have a structure like a streetlight illuminating on a street so as to irradiate the above-mentioned light to a solar photovoltaic power generation panel installed on the upper surface of a vehicle or a mobile body running or stopping thereunder.

The above-mentioned present method is achieved by using a light-projecting device which emits and projects light containing a wavelength component absorbed by each of all solar cell layers laminated in a multi-junction solar cell of a solar photovoltaic power generation panel of a vehicle, etc. as a power transmission portion. Thus, according to another manner of the present disclosure, there is provided a light-projecting device for feeding electric power in a non-contact manner to a vehicle, etc. installed with a solar photovoltaic power generation panel having a multi-junction solar cell, comprising:

a light-emitter which emits light containing a wavelength component absorbed by each of all solar cell layers laminated in the multi-junction solar cell; and a light irradiator which irradiates the light to a light receiving surface of the multi-junction solar cell of the solar photovoltaic power generation panel of the vehicle, etc.

In the above-mentioned device, the light-emitter may be, for instance, a laser or an LED (Accordingly, the light emitted by the light-emitter may be laser light or LED light.). Also, similarly to the method of the present disclosure, the light emitted by the light-emitter may contain photons having an energy exceeding the band gap of each solar cell layer as the wavelength component absorbed by each of the solar cell layers. Or, the light emitted by the light-emitter may contain, as the wavelength component absorbed by each of the solar cell layers, a component of a wavelength band which has a peak wavelength between an upper limit wavelength [nm] given by Expression (1) and a lower limit wavelength [nm] which is shorter than the upper limit wavelength by a predetermined width (The lower limit wavelength [nm] may be h·c/(e·Eg) [nm]−100 [nm].). Furthermore, the light intensity of the wavelength component absorbed by each solar cell layer contained in the light emitted by the light-emitter may be adjusted such that the differences of the generated currents in the respective solar cell layers become within a predetermined allowable range, such that the differences of the numbers of photoelectrons generated by absorption of photons in the respective solar cell layers become within a predetermined allowable range, or such that the differences of the number of photons absorbed in the respective solar cell layers given by Expression (2) become within a predetermined allowable range.

Moreover, in a case that a vehicle, etc. is a vehicle or a mobile body, the light-projecting device of the present disclosure may be designed such that the light irradiator irradiates the light to the solar photovoltaic power generation panel of the vehicle or mobile body which exists on a ground surface or water surface. For instance, the light-projecting device has a structure like a streetlamp which illuminates on the street, which irradiates the above-mentioned light to the solar photovoltaic power generation panel installed on the upper surface of a vehicle or a mobile body running thereunder.

Thus, according to the present disclosure as described above, there is provided a new method of feeding electric power to a vehicle, etc. in a non-contact manner by irradiating a solar photovoltaic power generation panel installed in a vehicle, etc. with the light generated by a light-projecting device and a light-projecting device for the method. In particular, in the structure of the present disclosure, since the light to be irradiated on a solar photovoltaic power generation panel is composed so that light absorption will surely occur in each solar cell layer of a multi-junction solar cell widely employed in a solar photovoltaic power generation panel, a significant amount of electric current is generated by the light absorption in each of the solar cell layers, and thereby it becomes possible to take out electric power from the multi-junction solar cell.

By the way, especially in the field of the vehicle technology, the realization of the automatic driving and electrically motorized society in the near future is aimed, and therefore, the realization of the non-contact electric power feeding to a vehicle is strongly desired. However, in the cases of the conventionally proposed non-contact electric power feeding methods using electromagnetic induction or magnetic resonance, power transmission and power receiving devices would be needed only for their purposes, resulting in a big cost increase, and further, there exists many technological problems to be solved, for example, that exact alignment of a power receiving portion and a power transmission portion is required, etc. On the other hand, in the situation that the explosive increase of the number of vehicles installed with a solar panel is expected for the purpose of the fuel consumption improvement of automobile, according to the way of the non-contact electric power feeding by irradiating a solar photovoltaic power generation panel with light, the non-contact electric power feeding will be achieved by utilizing the function, purposefully provided to those vehicles, to convert efficiently the sunlight into electricity, and therefore, it becomes possible to realize the non-contact electric power feeding at lower technical difficulty and lower cost.

Other purposes of the present disclosures will become clear by explanations of the following preferable embodiments of the present disclosure.

BRIEF DESCRIPTIONS OF DRAWINGS

DETAILED DESCRIPTION OF EMBODIMENTS

The Structure of Non-Contact Optical Power Feeding Method

Figure 1A:
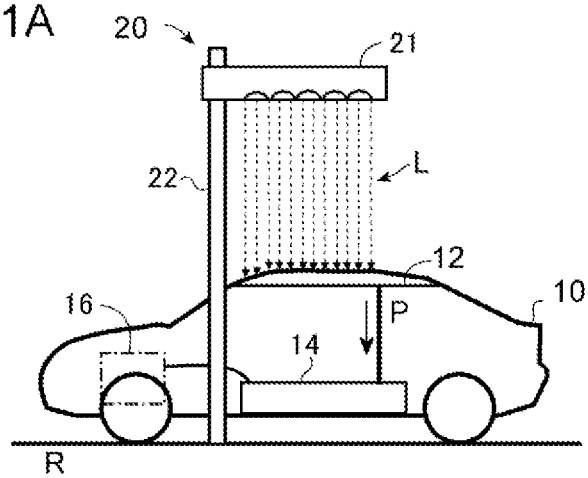
FIG. 1A is a schematic drawing illustrating one embodiment of the non-contact electric power feeding method to a vehicle, etc. installed with a solar photovoltaic power generation panel according to the present disclosure.

Referring to FIG. 1A, in a the non-contact optical power feeding method of the preferable present embodiment, a light-projecting device 20 which projects light L to a certain region is prepared. For instance, as illustrated, the light projecting device 20 may be formed like a streetlamp, having a light-emitter which generates light L in the upper portion of a pole 22, on which a light projector 21 projecting the light to a certain region, e.g., a lower region is mounted. The energy for generating the light L in the light projector 21 may be supplied to the light projector 21, for instance, through a power line (not shown) in an arbitrary manner. Then, on the region to which the light L is projected, a solar photovoltaic power generation panel 12, typically installed on a vehicle body upper surface of a vehicles 10, such as automobile, on a road surface R, is positioned, and in this condition, the solar photovoltaic power generation panel 12 is irradiated with the light L. In this regard, the solar photovoltaic power generation panel 12 may be of a type ordinarily used in this field. Thus, by the irradiation of the solar photovoltaic power generation panel 12 with the light L, as explained later, the light L is absorbed into a photoelectric conversion element (multi-junction solar cell) of the solar photovoltaic power generation panel 12, and then, the energy of the absorbed light is converted into electrical energy, which is outputted from the solar photovoltaic power generation panel 12 (P in the drawing) and accumulated in a storage battery or an electric storage device 14 carried in the vehicle 10. And, the electric energy accumulated in the storage battery or electric storage device 14 is used as energy for driving or operating machines and apparatus, such as an electric motor 16 (The output of the solar photovoltaic power generation panel 12 may be directly used for the operation of machines and apparatus, such as the electric motor 16). According to this structure, when the light L is absorbed by the multi-junction solar cell of the solar photovoltaic power generation panel 12 and a significant generated current flows out of the multi-junction solar cell, the non-contact electric power feeding by the light L is achieved through the solar photovoltaic power generation panel 12. Therefore, even when there is no sunlight or little sunlight, such as during night time (from the evening to the early morning), in a cloudy weather, in a rainy weather, or under a shade, or even when the energy demanded in a vehicle is not fully obtained only from the sunlight, the vehicle 10 will be fed with electricity and capable of obtaining energy.

Figure 1B:
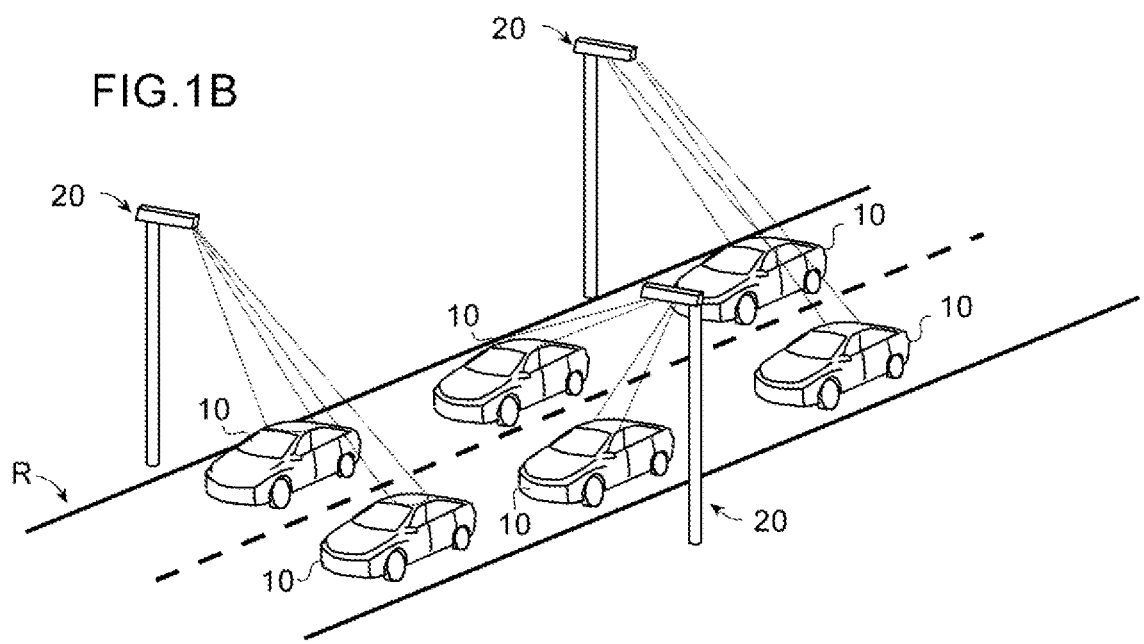
FIG. 1B is a schematic drawing explaining a condition that the non-contact electric power feeding method according to the present disclosure is applied to vehicles running or stopping on a road.

The non-contact optical power feeding method according to the above-mentioned present embodiment may be performed in an arbitrary manner. For instance, as illustrated schematically in FIG. 1B, the electric power feeding with light (optical power feeding) to vehicles 10 may be performed by arranging light-projecting devices 20 along the road R on which the vehicles are running, and, irradiating the light L to the upper surfaces of the vehicles 10 passing through thereunder (the vehicles may be stopped during the feeding of electric power.). Further, although not shown, also in cases of other mobile bodies, such as two-wheeled vehicles placed on a ground surface or a road surface, aircraft, vessels floating on a water surface, etc., the optical power feeding may be achieved similarly to the above by irradiating a solar photovoltaic power generation panel installed therein with the light from the light-projecting device 20. Furthermore, the non-contact optical power feeding method according to the present embodiment may be used for not only a mobile body but also electric feeding of arbitrary machines and apparatus installed with a solar photovoltaic power generation panel and it should be understood that such cases belong to the scope of the present embodiment, also.

The Structure of Light Projector

Figure 2:
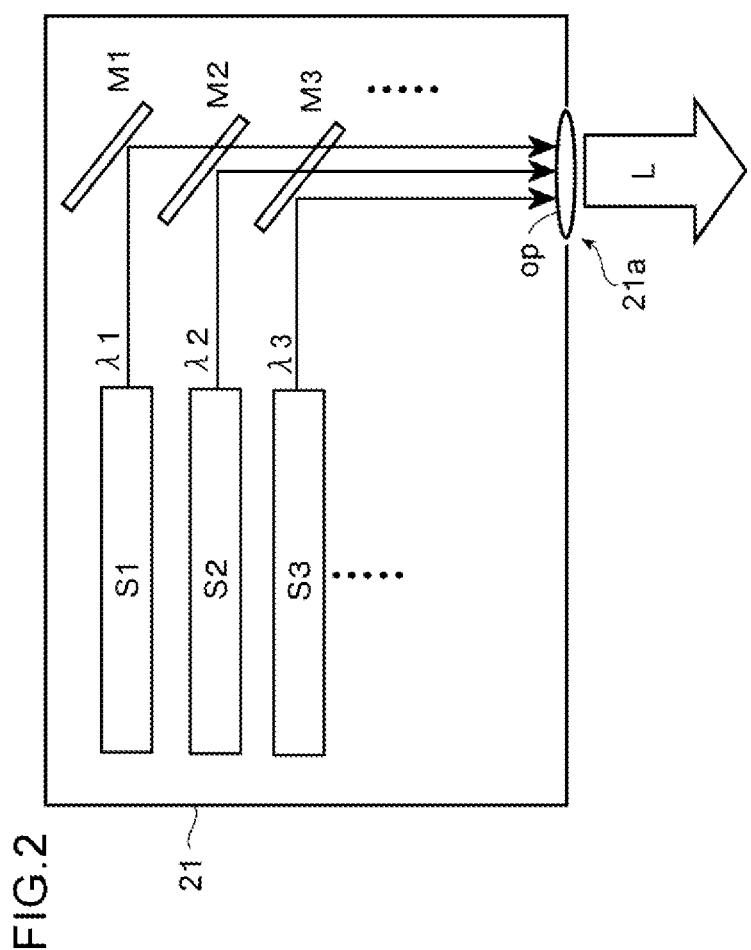
FIG. 2 is a drawing showing schematically a structure of a light-projecting device used in one embodiment of the non-contact electric power feeding method according to the present disclosure.

As schematically drawn in FIG. 2, the light projector 21 in the light-projecting device 20 illustrated in FIG. 1 has at least two light-emitters S1~ (In the drawing, the number of light-emitters is 3), which generate lights $\lambda 1\sim$ of mutually different wavelengths, and optical instruments (reflective mirrors M1~, a light condenser op, etc.), which condense the lights $\lambda 1\sim$ emitted from the respective light-emitters S1~, emits them as the light L from a light projecting opening 21a and irradiates it to the solar photovoltaic power generation panel 12. While an arbitrary light source may be used as the light-emitters S1~, considering that the photoelectric conversion efficiency in the solar photovoltaic power generation panel 12, a laser device or an LED with high monochromaticity of each light emitted therefrom can be used, as explained later. In this regard, it is sufficient that the light sources just satisfy the conditions of the characteristics of the wavelengths of the light irradiated from the light projector explained below, and the number of the light sources may be more than the number of the solar cell layers of the multi-junction solar cell in the solar photovoltaic power generation panel. Further, with respect to the light L emitted from the light projecting opening 21a, its divergence angle may be appropriately adjusted using optical instruments so that the light L will be more certainly irradiated to the solar photovoltaic power generation panel 12.

Figure 3A:
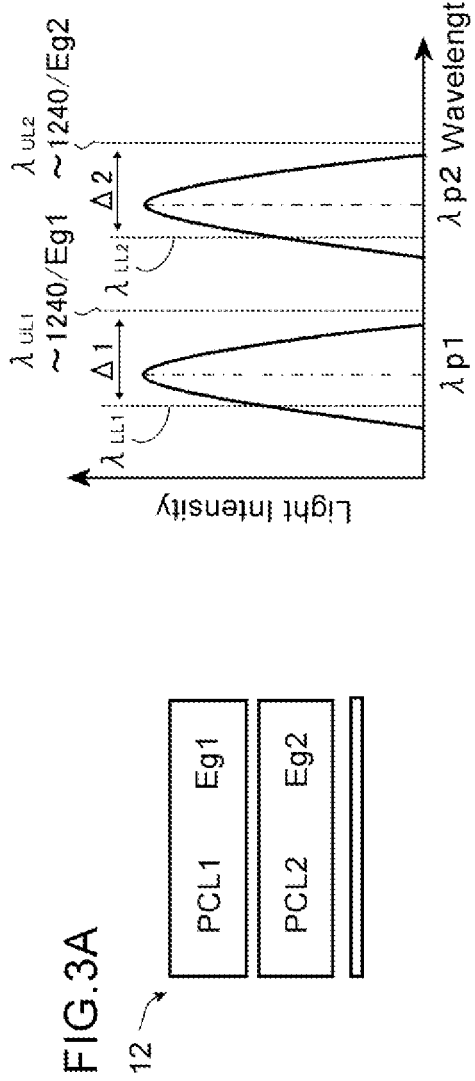
FIG. 3A shows a schematic drawing of a structure of 2 junction solar cell, and a schematic drawing of wavelength characteristic of the light to be irradiated to the 2 junction solar cell in the non-contact electric power feeding method according to the present disclosure.
Figure 3B:
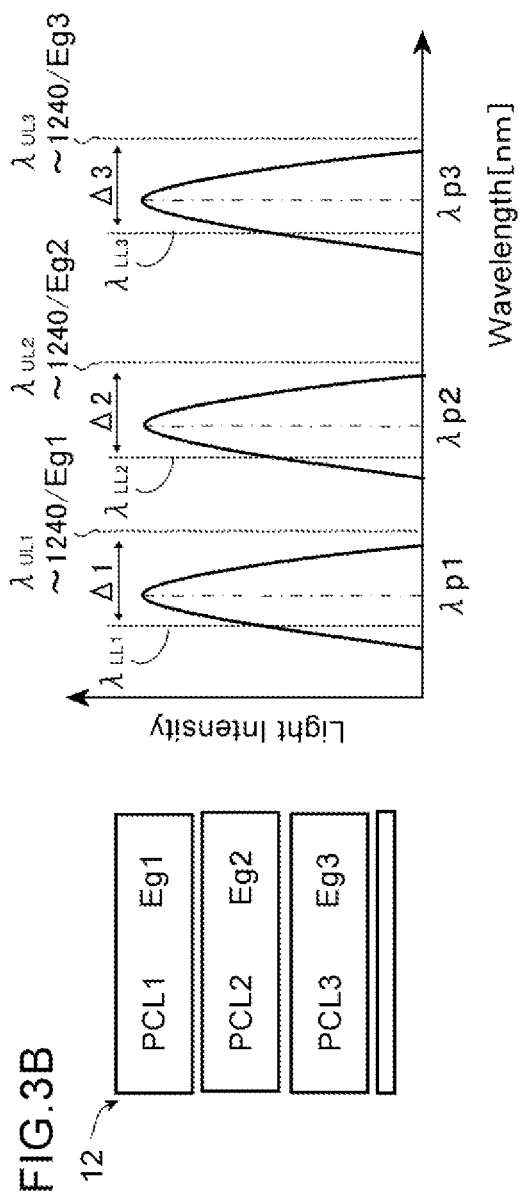
FIG. 3B shows a schematic drawing of a structure of 3 junction solar cell, and a schematic drawing of wavelength characteristic of the light to be irradiated to the 3 junction solar cell in the non-contact electric power feeding method according to the present disclosure.

The Conditions of Characteristics of Wavelengths of Light Irradiated From a Light Projector As noted, in most cases of the solar photovoltaic power generation panel 12 designed to be installed on a vehicle, etc. for using the solar energy by converting it to electric energy, the multi-junction solar cell is employed as a photoelectric conversion element. In this multi-junction solar cell, as schematically drawn in FIGS. 3A and 3B left, a plurality of solar cell layers PCL1~, having mutually different energy band gaps Eg1~, are laminated, and thereby the respective solar cell layers PCL1~ absorb the lights of different wavelength bands and convert them into electric power, and therefore, the light energy of more wavelength components in the sunlight whose wavelength band extends over a broad range can be converted into electric energy so that more solar energy can be taken in. However, since the solar cell layers PCL1~ laminated in the multi-junction solar cell are electrically connected in series, electric current cannot flow through all the solar cell layers PCL1~ when no light absorption occurs and no electric current is generated in at least one of the solar cell layers PCL1~, and in that case, it becomes difficult to take electric power out of the multi-junction solar cell. Thus, in the optical power feeding method of this embodiment, the light L irradiated from the light projector 21 to the solar photovoltaic power generation panel 12 is prepared to contain all of the wavelength components absorbed by the respective solar cell layers PCL1~ such that light absorption will occur in all the solar cell layers PCL1~. Namely, in the case of 2 junction photovoltaic cell as in FIG. 3, the light L is prepared so that the wavelength component absorbed by PCL1 and the wavelength component absorbed by PCL2 will be contained, and in the case of 3 junction photovoltaic cell as in FIG. 3 B, the light L is prepared so that the wavelength component absorbed by PCL1, the wavelength component absorbed by PCL2 and the wavelength component absorbed by PCL3 will be contained.

Moreover, in each solar cell layer PCL1~, photons having the photon energy exceeding the band gap Eg1~ of each solar cell layer PCL1~ are absorbed, and photons which is not absorbed cannot be taken out as electric power, resulting in the loss of energy (refer to Note 1 below). Thus, in order to suppress energy loss as low as possible and to increase the photoelectric conversion efficiency, it is preferable that photons to be absorbed by each solar cell layer PCL1~ in the light L are prepared to be those having the photon energy exceeding the corresponding band gap Eg1~. In this respect, the wavelength $\lambda_{ULi}$ [nm] of a photon having the energy of the band gap Egi [eV] of each solar cell layer PCLi (i=1~) (the upper limit wavelength) is given by:

$$\lambda_{ULi} [nm] = h \cdot c/(e \cdot Egi) \approx 1240/Egi \quad (3)$$

(Here, h [Js] is the Planck constant; c [m/s] is the speed of light; and e [C] is the electronic charge.), and therefore, it is preferable that the wavelength component that each solar cell layer PCLi is made to absorb in the light L is prepared to be $\lambda_{ULi}$ [nm] given by Expression (3) or below.

[Note 1] As already noted, in a multi-junction solar cell, usually, a solar cell layer having a larger band gap (a shorter absorption wavelength) is laid to be closer to the light receiving side. Thus, photons which were not absorbed in each solar cell layer will be absorbed by solar cell layers laid under it (photons having energy smaller than the minimum band gap Eg are not absorbed, resulting in the energy loss.). However, as explained below, in photons absorbed in each solar cell layer, since the energy loss in taking out energy as electric power becomes larger as the photon energy exceeding the band gap Eg becomes larger, it is preferable that photons in a wavelength component prepared to be absorbed by each solar cell layer PCLi are made absorbed surely in the corresponding solar cell layer PCLi as noted above, and thus, it becomes preferable to make the wavelength of the photons below $\lambda_{ULi}$ [nm] given by Expression (3).)

On the other hand, with respect to photons to be absorbed in each solar cell layer PCLi, when the photon energy is larger than the band gap Eg, in taking out their energy as electric power, the portion exceeding the band gap Eg in the photon energy becomes energy loss. So, in order to suppress energy loss as low as possible and to increase the photoelectric conversion efficiency, it is preferable that the wavelength component prepared to be absorbed by each solar cell layer PCLi in the light L is prepared so that its wavelength will be within a range not greatly shorter than $\lambda_{ULi}$ [nm] given by Expression (3).

By the way, when each wavelength component $\lambda i$ of the light L is given by laser light or LED light, the wavelength spectrum of each wavelength component $\lambda i$ has an upwardly convex shape. Thus, in order to satisfy the above-mentioned preferable conditions with respect to the wavelength of each wavelength component $\lambda i$, preferably, each wavelength component $\lambda i$ may be prepared such that the peak wavelength $\lambda_{pi}$ of its wavelength spectrum satisfies $\lambda_{LLi} < \lambda_{pi} < \lambda_{ULi}$ as schematically drawn in FIGS. 3A and 3B right, respectively. Here, $\lambda_{LLi}$ is the lower limit wavelength of the range in which the peak wavelength $\lambda_{pi}$ is to be encompassed, and the width (a predetermined width) $\Delta i$ between $\lambda_{ULi}$ and $\lambda_{LLi}$ may be appropriately set while taking the photoelectric conversion efficiency into account. In a typical light source employed in this embodiment, the predetermined width $\Delta i$ may be e.g. 100 nm.

Light Intensity of Each Wavelength Component Irradiated from Light Projector

As noted above, when the light absorption occurs and an electric current is generated in each solar cell layer of a multi-junction solar cell, it will become possible to take out electric power to the exterior of the multi-junction solar cell. In this condition, if the electric currents generated in the respective solar cell layer differ mutually, the electric current flowing through the whole solar cell layers will be restricted to the minimum amount in the electric currents generated in all the solar cell layers, and thus, in each solar cell layer, the energy equivalent to the difference between the electric current to be generated corresponding to the number of the absorbed photons and the actually flowing electric current becomes lost as heat, resulting in the reduction of the photoelectric conversion efficiency corresponding to the difference. Then, the electric current to be generated in each solar cell layer corresponds to the number of the photons absorbed in each solar cell layer, which is determined based on the light intensity of the wavelength component which reaches each solar cell layer and is absorbed therein. Therefore, in the non-contact optical power feeding method of the present embodiment, for suppressing the reduction of the photoelectric conversion efficiency, preferably, the light intensity of each wavelength component to be absorbed in each solar cell layer may be adjusted so that almost no difference will be generated in the electric currents generated in the respective solar cell layers, for example, so that such a difference will be within an allowable range which may be set appropriately. In this regard, for instance, the allowable range may be set so that the difference will be within 10%, preferably within 5% and more preferably within 3%, etc. (the photoelectric conversion efficiency becomes better as the range becomes narrower.). The adjustment of the light intensity of each wavelength component can be achieved by adjusting the output of each light source or using an optical filter.

In one manner of the adjustment of the light intensity of each wavelength component in the light L, through measuring in an arbitrary way or estimating experimentally the electric current or the number of photoelectrons to be generated in each solar cell layer in a multi-junction solar cell to which the non-contact optical power feeding method of this embodiment will be applied, the light intensity of each wavelength component in the light L may be adjusted so that the difference of the electric currents generated in the respective solar cell layers will be within the allowable range as mentioned above.

Further, in another manner of the adjustment of the light intensity of each wavelength component in the light L, the number of photons Ni absorbed in each solar cell layer PCLi is estimated by $$Ni = Pi \cdot Ti/(h \cdot c/\lambda i) \quad (4),$$

using the light intensity Pi[J/s] of the wavelength component λi absorbed in each solar cell layer (at the output from a light projector or on the light receiving surface of a multi-junction solar cell), the transmissivity Ti at which each wavelength component reaches the corresponding solar cell layer which absorbs it, the Planck constant h [Js], the speed of light c [m/s] and the wavelength λi [nm] of each wavelength component (it may be the peak wavelength.). (Here, h·c/λi is the energy of a single photon.) Thus, for each solar cell layer in the multi-junction solar cell to which the non-contact optical power feeding method of this embodiment will be applied, while measuring experimentally the above-mentioned transmissivity Ti beforehand, the light intensity Pi of each wavelength component of the light L may be adjusted so that the number of photons Ni estimated by the Expression (4) will be within the above-mentioned allowable range.

EXAMPLE (i) When the multi-junction solar cell of the solar photovoltaic power generation panel to which the non-contact optical power feeding is applied is a 3 junction solar cell which consists of InGaP/GaAs/Ge, the band gap [eV] of each layer and the upper limit wavelength [nm] of each wavelength component according to Expression (3) are as follows:

| Layer No. | Composition | Band gap [eV] | Upper limit wavelength [nm] |
|---|---|---|---|
| 1 | InGaP | 1.9 | 652 |
| 2 | GaAs | 1.4 | 886 |
| 3 | Ge | 0.7 | 1771 |

Thus, the light source which generates the light of the wavelength component to be absorbed in each layer as mentioned above may be, for instance, as follows, respectively:

1 AlInGaP Series Semiconductor Laser
(Oscillation wavelength: 600 nm)
2 AlGaAs Series Semiconductor Laser
(Oscillation wavelength: 850 nm)
3 InGaAs/InGaAsP Distorted MQM (MultiQuantumWell) Type Semiconductor Laser
(Oscillation wavelength: 1700 nm)

(ii) When the multi-junction solar cell of the solar photovoltaic power generation panel to which the non-contact optical power feeding is applied is a 2 junction solar cell which consists of perovskite (MAPbI3)/Si, the band gap [eV] of each layer and the upper limit wavelength [nm] of each wavelength component according to Expression (3) are as follows:

| Layer No. | Composition | Band gap [eV] | Upper limit wavelength [nm] |
|---|---|---|---|
| 1 | Perovskite | 1.8 | 689 |
| 2 | Si | 1.1 | 1033 |

Thus, the light source which generates the light of the wavelength component to be absorbed in each layer as mentioned above may be, for instance, as follows, respectively:

1 AlInGaP Series Semiconductor Laser
(Oscillation wavelength: 650 nm)
2 InGaAs Series Semiconductor Laser
(Oscillation wavelength: 1000 nm)

The full width at half maximum of each laser mentioned above may be 10 nm or less, and its power may be about 1 kW. In this regard, the light source may be LED and, in that case, its full width at half maximum may be 50 nm or less and its power may be about 1 kW.

Although the above explanation has been described with respect to embodiments of the present disclosure, it will be apparent for those skilled in the art that various modifications and changes are possible, and that the present disclosure is not limited to the above-illustrated embodiments and may be applied to various devices and apparatus without deviating from the concepts of the present disclosure.

The invention claimed is:

1. A method of non-contact electric power feeding to an apparatus, which is any one of a vehicle, a mobile body, a machinery, and an appliance, installed with a solar photovoltaic power generation panel having a multi-junction solar cell, comprising steps of:
   (a) preparing a light-projecting device which emits light containing a wavelength component absorbed by each of all solar cell layers laminated in the multi-junction solar cell and projects the light;
   (b) irradiating the light projected from the light-projecting device onto a light receiving surface of the multi-junction solar cell of the solar photovoltaic power generation panel of the apparatus; and
   (c) taking out electric power generated from the multi-junction solar cell by the irradiation of the light,
   wherein a light intensity of the wavelength component absorbed by each of the solar cell layers contained in the light projected from the light-projecting device is adjusted such that a difference in a number of photoelectrons generated by absorption of photons in the respective solar cell layers becomes within a predetermined allowable range.

2. The method of claim 1, wherein the light projected from the light-projecting device contains, as the wavelength component absorbed by each of the solar cell layers, photons having energy which exceeds beyond a band gap of the corresponding solar cell layer.

3. The method of claim 2, wherein the light projected from the light-projecting device contains, as the wavelength component absorbed by each of the solar cell layers, a component of a wavelength band having a peak wavelength in a range from an upper limit wavelength [nm] given by:

$$h \cdot c/(e \cdot Eg)$$

with the band gap of the corresponding solar cell layer Eg[eV], the Planck constant h[Js], the speed of light c[m/s] and the electron charge e[C], to a lower limit wavelength [nm] which is shorter than the upper limit wavelength by a predetermined width.

4. The method of claim 3, wherein the lower limit wavelength [nm] is h·c/(e·Eg) [nm]–100 [nm].

5. The method of 1, wherein the light intensity of each of the wavelength components is adjusted such that a difference in a number of photons absorbed in each of the said solar cell layers given by: Pi·Ti/(h·c/λi) with a light intensity Pi of each of the wavelength components, a transmissivity Ti at which each of the wavelength components reaches the corresponding solar cell layer, the Planck constant h [Js], the speed of light c[m/s] and a wavelength of each of the wavelength components becomes within a predetermined allowable range.

6. The method of claim 1, wherein the light intensity of the wavelength component absorbed by each of the solar cell layers contained in the light projected from the light-projecting device is adjusted such that a difference of electric currents generated in the respective solar cell layers becomes within a preset allowable range.

7. The method of claim 1, wherein the light projected by the light-projecting device is laser light.

8. The method of claim 1, wherein the light projected by the light-projecting device is LED light.

9. The method of claim 1, wherein the apparatus is a vehicle or a mobile body, and the light-projecting device is a device which projects light to the solar photovoltaic power generation panel of the vehicle or the mobile body, the vehicle or the mobile body existing on a ground surface or a water surface.

* * * * *